ELECTRICALLY TUNABLE FIELD-EFFECT TRANSISTOR CIRCUIT

Filed Aug. 23, 1963

INVENTOR.
DAVID J. CARLSON
BY Eugene M. Whitacre
Attorney

United States Patent Office 3,229,120
Patented Jan. 11, 1966

3,229,120

ELECTRICALLY TUNABLE FIELD-EFFECT TRANSISTOR CIRCUIT

David J. Carlson, Princeton, N.J., assignor to Radio Corporation of America, a corporation of Delaware Filed Aug. 23, 1963, Ser. No. 304,091
14 Claims. (Cl. 307—88.5)

This invention relates in general to signal translating circuits and more particularly to electrically tunable amplifier and converter circuits.

Tuned amplifier circuits have been used to obtain high-load impedance (output impedance) by utilizing the intrinsic capacitance of an active element and the stray capacitance of the amplifier circuit, so that these capacitances, which limit the high frequency response of untuned amplifier circuits, are used in tuning and cease to be detrimental. The utilization of tuned input and output circuits in the amplifier provides selectivity with respect to frequencies. These characteristics make tuned amplifier circuits especially suitable for radio frequency amplifiers and intermediate frequency amplifiers in superheterodyne receivers, for example.

In prior art circuits, the operating frequency of the amplifier circuit is sometimes selected by means of variable capacitors which in combination with the intrinsic capacitance of the active element and the stray capacitance of the circuit constitute the capacitance of a tunable circuit. Controlling the operating frequency of an amplifier circuit by electrically varying the intrinsic capacitance of the active element would be especially desirable.

Accordingly, it is an object of this invention to provide an improved electrically tunable signal translating circuit.

It is another object of this invention to provide an improved tunable input, tunable output amplifier circuit having simultaneous tuning of both the input and output circuits as a function of a single control voltage.

An electrical circuit embodying the invention includes an insulated-gate field-effect transistor. Such a device has source and drain electrodes formed on a substrate of semiconductor material and the gate electrode insulated from the substrate. The source and drain electrodes are in rectifying contact with the substrate. Input circuit means including a first inductor are coupled to the source electrode for applying input signals to said electrical circuit. Output circuit means including a second inductor are coupled to the drain electrode to derive an output signal. Circuit means couple the gate electrode to a point of reference potential. Circuit means are connected to the drain electrode for applying a unidirectional operating voltage to the electrical circuit. Circuit means are coupled to the substrate of semiconductor material for applying a control voltage to the substrate, so that each of the rectifying junctions exhibit a capacitance to tune said input and output circuits respectively. In accordance with a feature of the invention the control voltage applied to the substrate of semiconductor material is variable so that tuning of the input and output circuits is controlled by the voltage as a function of the amplitude of the control voltage.

The novel features which are considered to be characteristic of the invention are set forth in particularity in the appended claims. The invention, itself, however, both as to its organization and method of operation as well as additional objects and advantages thereof will best be understood from the accompanying drawing in which:

Figures 1, 2, 3, 4, 5, 6, 8:
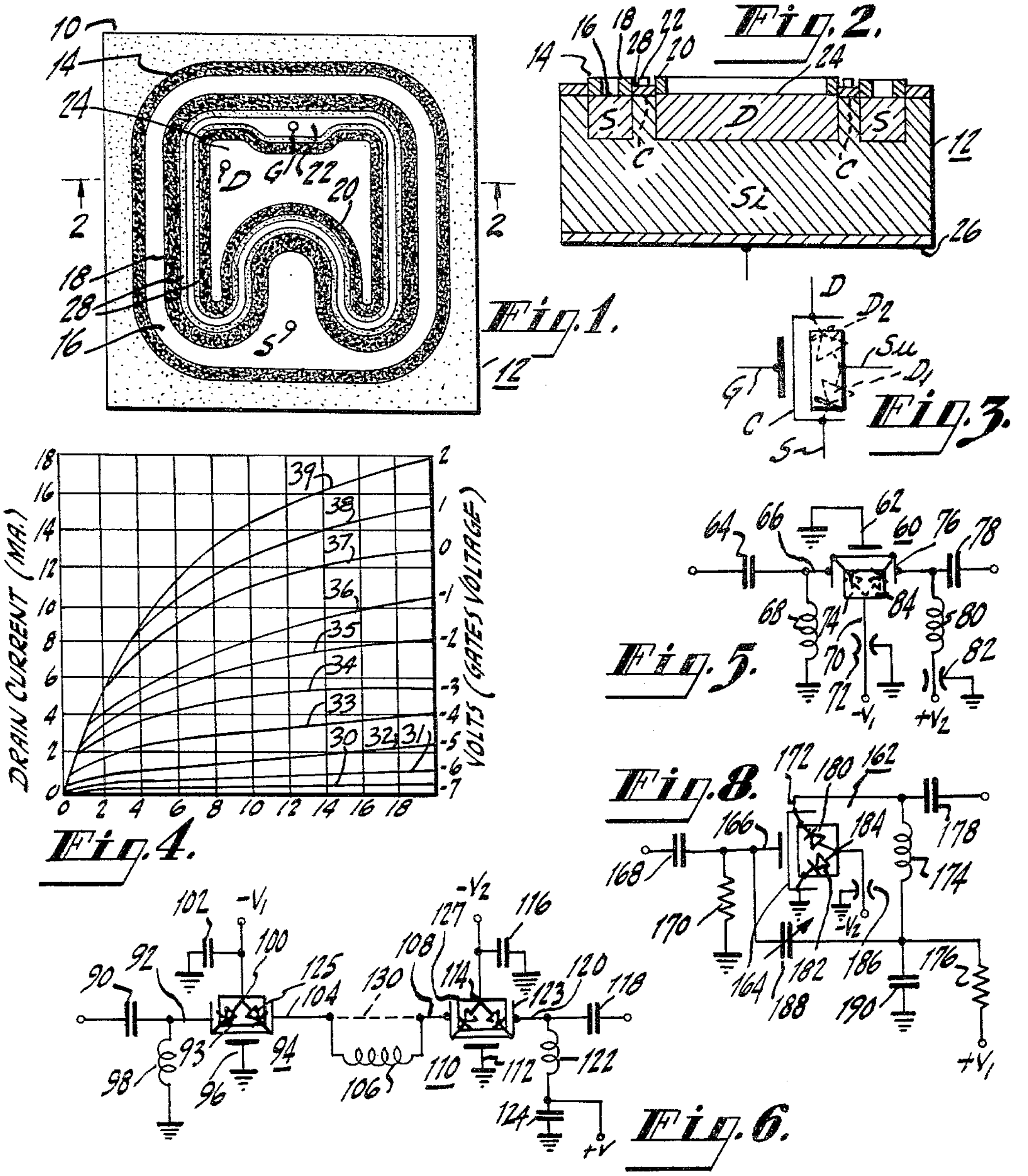
FIGURE 1 is a diagrammatic view of an insulated-gate field-effect transistor suitable for use in circuits embodying the invention.
FIGURE 2 is a cross section view taken along section line 2—2 of FIGURE 1.
FIGURE 3 is a symbolic representation of an insulated-gate field-effect transistor.
FIGURE 4 is a graph showing the family of drain current versus source-to-drain voltage curves for various values of gate-to-source voltages for the transistor of FIGURE 1.
FIGURE 5 is a schematic circuit diagram of a signal translating circuit embodying the invention.
FIGURE 6 is a schematic circuit diagram of a two-stage cascaded amplifier circuit embodying the invention.
FIGURE 8 is a schematic circuit diagram of a neutralized radio frequency amplifier embodying the invention.

Referring now to the drawings and particularly to FIGURE 1, a field-effect transistor 10 which may be used with circuits embodying the invention includes a substrate or a body 12 of semiconductor material. The body 12 may be either a single crystal or polycrystalline and may be of any of the semiconductor materials used to prepare transistors in the semiconductor art. For example, the body 12 may be nearly intrinsic silicon, such as, for example, lightly doped P-type silicon of 100 ohm-cm. material.

In the manufacture of the device shown in FIGURE 1 heavily doped silicon dioxide is deposited over the surface of the silicon body 12. The silicon dioxide is doped with N-type impurities. By means of a photo-resist and acid etching, or other suitable technique, the silicon dioxide is removed where a gate electrode is to be formed, and around the outer edges of the silicon wafer as viewed on FIGURE 1. The deposited silicon dioxide is left over those areas where the source-drain regions are to be formed.

The body 12 is then heated in a suitable atmosphere, such as in water vapor, so that exposed silicon areas are oxidized to form grown silicon dioxide layers indicated by the lightly stippled areas of FIGURE 1. During the heating process, impurities from the deposited silicon dioxide layer diffuse into the silicon body 12 to form the source and drain regions. FIGURE 2, which is a cross section view taken along section 2—2 of FIGURE 1, shows the source-drain regions labelled S and D respectively.

By means of another photo-resist and acid etching or like step, the deposited silicon dioxide over part of the source-drain diffused regions is removed. Electrodes are formed for the source, drain and gate regions by evaporation of a conductive material by means of an evaporation mask. The conductive material evaporated may be chromium and gold in the order named, for example, but other suitable metals may be used.

The finished wafer is shown in FIGURE 1, in which the lightly stippled area between the outside boundary and the first darker zone 14 is grown silicon dioxide. The white area 16 is the metal electrode corresponding to the source electrode. Dark or more heavily stippled zones 14 and 18 are deposited silicon dioxide zones overlying the diffused source region, and the dark zone 20 is a deposited silicon dioxide zone overlying the diffused drain region. White areas 22 and 24 are the metallic electrodes which correspond to the gate and drain electrodes respectively. The stippled zone 28 is a layer of grown silicon dioxide on a portion of which the gate electrode 22 is placed and which insulates the gate electrode 22 from the substrate silicon body 12 and from the source and drain electrodes as shown in FIGURE 2.

The silicon wafer is mounted on a conductive base or header 26 as shown in FIGURE 2. The input resistance of the device at low frequencies is of the order of $10^{14}$ ohms. The layer of grown silicon dioxide 28 on which the gate electrode 22 is mounted, overlies an inversion layer or conductive channel C connecting the source and drain regions. The gate electrode 22 is displaced symmetrically between the source region S and the drain region D. If desired, the gate electrode 22 may be displaced towards the source region and may overlap the deposited silicon dioxide layer 18.

Reference is now made to FIGURE 2 of the drawings. The boundaries separating the source and drain regions S and D and the body of silicon substrate 12 effectively operate as a pair of rectifying junctions coupling the silicon substrate 12 to the source and drain electrodes 16 and 24, in such a manner that a bias voltage applied to the substrate 12, which is negative with respect to the voltage of the drain and source electrodes 16 and 24, renders the rectifying junctions nonconductive, i.e., reverse biased. In other words, the substrate acts as the anode electrode of these rectifying junctions.

By reverse biasing the rectifying junctions a capacitance effect may be obtained. When reverse biased, each of the rectifying junctions exhibits a capacitance, the value of which is a function of the reverse biasing voltage and the junction area. Thus, the magnitude of the capacitance exhibited by the rectifying junctions may be determined during the manufacture by selecting the size of the junction area. The limitation, however, is that the variation in junction area should be within a range in which other desirable characteristics of the insulated-gate field-effect transistor are maintained.

FIGURE 3 is a symbolic representation of the insulated-gate field-effect transistor previously described in FIGURES 1 and 2. There is shown the gate electrode G, the drain electrode D, the source electrode S, and the substrate of semiconductor material $S_u$. It should be noted that electrodes D and S operate as the drain and source electrodes as a function of the polarity of the bias potential applied therebetween; i.e., the electrode to which a positive bias potential is applied (relative to the bias potential applied to the other electrode) operates as a drain electrode, and the other electrode operates as a source electrode.

The drain and source electrodes are connected to each other by a conductive channel C. The majority current carriers (in this case electrons) flow from source-to-drain in this thin channel region close to the surface. The conductive channel C is shown in FIGURE 2 in dotted lines.

The source and drain regions S and D shown in FIGURE 2 are in rectifying contact with the substrate 12, illustrated in FIGURE 3 by a pair of rectifying junctions $D_1$ and $D_2$ respectively. The anode electrodes of the rectifying junctions $D_1$ and $D_2$ are at the substrate $S_u$ and the cathode electrodes of rectifying junctions $D_1$ and $D_2$ are respectively at the source and drain electrodes S and D. If the body 12 of semiconductor material is lightly doped N-type silicon, and the source and drain regions are doped with P-type impurities, the rectifying junctions $D_1$ and $D_2$ are poled opposite to the way shown in FIGURE 3; i.e., the cathode electrodes of rectifying junctions $D_1$ and $D_2$ are then at the substrate $S_u$.

FIGURE 4 is a family of curves 30–39 illustrating the drain current versus drain voltage characteristic of the transistor of FIGURE 1 for different values of gate-to-source voltage. A feature of an insulated-gate field-effect transistor is that the zero bias characteristic can be at any of the curves 30–39. In FIGURE 4 the curve 37 corresponds to the zero bias gate-to-source voltage. Curves 38 and 39 represent positive gate voltages relative to the source, and the curves 30–36 represent negative gate voltages relative to the source.

The location of the zero bias curve is selected during the manufacture of the transistor, i.e., by controlling the time or the temperature, or both, during the step of the process in which the silicon dioxide layer 28, shown in FIGURES 1 and 2, is grown. The longer the transistor is baked and the higher the temperature in a dry oxygen atmosphere the larger the drain current will be for a given amount of drain voltage at zero bias between the source and gate electrodes.

Referring now to FIGURE 5, there is shown a signal translating circuit including a field-effect transistor 60, similar to the one shown in FIGURES 1 and 2. The gate electrode 62 of the field-effect transistor 60 is connected to a point of fixed reference potential shown as ground. Input signals are coupled through a coupling capacitor 64 to the source electrode 66 of the field-effect transistor 60. An inductor 68 is coupled between the source electrode 66 and ground. The inductor 68 forms part of the input circuit. The substrate of semiconductor material 70 is coupled to a source of bias potential $-V_1$, not shown. A feedthrough capacitor 72 bypasses the source of bias potential $-V_1$ to ground at signal frequencies. The rectifying junction 74, which exists between the source electrode 66 and the substrate of semiconductor material 70 is thus connected in parallel with inductor 68. The rectifying junction 74 exhibits a capacitance that is a function of the reverse bias voltage applied across it. This capacitance exhibited by the rectifying junction 74 also forms part of the input circuit, and in conjunction with the inductor 68 determines the tuning of the signal input circuit.

Output signals are derived from the drain electrode 76 through a coupling capacitor 78 which may be coupled to a utilization circuit, not shown. An inductor 80, which forms part of the output circuit, is connected between the drain electrode 76 and a source of unidirectional operating potential $+V_2$. A feedthrough capacitor 82 bypasses the source of unidirectional potential $+V_2$ to ground at signal frequencies. The rectifying junction 84, that exists between the drain electrode 76 and the substrate of semiconductor material 70, also exhibits a capacitance as a function of the reverse bias voltage applied to the substrate 70. The capacitance exhibited by the rectifying junction 84 and the inductor 80 provides a tuned output circuit; resonant at the same resonant frequency of the input circuit.

The grounded-gate field-effect transistor circuit of FIGURE 5 has a low input impedance and a high output impedance. As previously pointed out, the capacitance exhibited by each of the rectifying junctions is a function of the magnitude of the reverse biasing voltage across the junction. Therefore, because the voltage $+V_2$ is applied in series with the drain-source current path of transistor 60 and there is a voltage drop across the drain-source current path, the magnitude of the voltage across the rectifying junction 84 is larger than the magnitude of the reverse biasing voltage across the rectifying junction 74. This difference in magnitude of the reverse biasing voltages respectively across junctions 84 and 74, causes the capacitance exhibited by the rectifying junction 74 to be larger in magnitude than the capacitance exhibited by the rectifying junction 84.

In addition, because the capacitance exhibited by each of the rectifying junctions 74 and 84 is different, to tune the corresponding input and output circuits at the same frequency the magnitude of the inductor 68 must be smaller than the magnitude of the inductor 80. In other words, the LC product of the input circuit must be equal to the LC product of the output circuit.

From the considerations above described, it should also be noted that the inductance-capacitance ratio of the input circuit is smaller than the inductance-capacitance ratio of the output circuit. This inequality can be translated into a smaller resonant input impedance of the input circuit than the resonant impedance of the output circuit, which in turn provides the required selectivity to the input and output circuits.

The capacitance exhibited by each of the rectifying junctions may be determined by the following relationship:

$$C=\frac{K}{V^{\frac{1}{n}}}=KV^{\frac{-1}{n}}$$

where C is the capacitance exhibited by the rectifying junction, K is a factor proportional to junction area, V is the reverse voltage across the rectifying junction (the difference of potential, respectively, between the electrodes 76 and 66 and the substrate 70), and $n$ is a factor that depends on the material of the rectifying junction, for example, $n=3$ for a silicon rectifying junction.

Variable tuning is provided in the circuit shown in FIGURE 5, by making the bias voltage $-V_1$ variable. Because the capacitance vs. bias voltage characteristic of each of the rectifying junctions 74 and 84 is logarithmic and the magnitude of the reverse biasing voltage across each junction is different in magnitude, an incremental change in the control voltage $-V_1$ produces proportional variation in the capacitance exhibited by each of the rectifying junctions. This factor permits simultaneous tuning of the input and output circuits to the same frequency.

As previously explained, the LC product of the input and output circuits must be equal to tune the input and output circuits to the same frequency. If the capacitance of the input circuit is five times larger than the capacitance of the output circuit, for example, 100% change of the input capacitance must be accompanied by 100% in the output capacitance in order to tune the input and output circuits to the same frequency. However, the incremental change in the capacitance in the output circuit is only one fifth of the incremental change of capacitance in the input circuit.

The range of frequencies to which the input and output circuits can be electrically tuned automatically, i.e., the tracking range, is relatively small due to the intrinsic characteristic of the rectifying junctions.

The tracking range, however, may be extended by providing a resistor in series with the source-drain current path. If a resistor is connected in series with the source-drain current path, the field-effect current control provided by the substrate provides additional tracking means, i.e., when the control voltage $-V_1$ is varied the voltages across the rectifying junctions vary as a function of the change in current flow through the source-drain current path. This is due to the voltage drop across the series resistor which in fact provides an effective variation (compensation) of the voltage supply $V_2$.

When the voltage $-V_1$ is increased, i.e., is made more negative, the current flowing through the source-drain current path decreases, with the consequent decrease of the voltage drop across the resistor. Thus, the biasing voltage across the rectifying junction connected to the resistor is effectively increased. The increased value of the biasing voltage is larger than the increase of effective biasing voltage that results from a variation of control voltage in a circuit having no series resistor.

The added resistor in effect provides an unsymmetrical biasing voltage arrangement of the rectifying junctions, so that the rectifying junction that exhibits smaller capacitance is biased by a reverse biasing voltage that is not linear with respect to the variation of control voltage, while the rectifying junction that exhibits the larger capacitance is biased with a voltage that is linear with repect to the variation in control voltage.

In order to control the tuning of the amplifier circuit as described, the capacitance exhibited by the rectifying junctions should constitute a large portion of the capacitance of the tunable input and output circuits so that a change in the capacitance exhibited by the rectifying junctions controls the tuning of the circuit. Although the circuit shown in FIGURE 5 comprises a grounded-gate amplifier stage, this amplifier circuit may be modified to be a common gate amplifier stage having a predetermined gate-to-source bias voltage.

Reference is now made to FIGURE 6 of the drawings, which is a variation of the circuit shown in FIGURE 5, and which shows two grounded gate amplifier stages connected in cascade.

Input signals are coupled through a capacitor 90 to the source electrode 92 of the field-effect transistor 94 which is the active element of the input stage of the amplifier circuit. The gate electrode 96 of the field-effect transistor 94 is grounded. An inductor 98 is connected between the source electrode 92 and ground to form a tunable input circuit with the capacitance exhibited by the rectifying junction 93. The substrate 100 of semiconductor material is connected to a source of bias potential $-V_1$, not shown. A capacitor 102 is connected between the substrate 100 of semiconductor material and ground to bypass signal frequencies.

The drain electrode 104 is connected through an inductor 106 to the source electrode 108 of the field-effect transistor 110 which is the active element of the output stage of the amplifier circuit. The gate electrode 112 of the field-effect transistor 110 may be grounded as shown, or alternatively the gate electrode 112 may be referred to the source electrode 108 through a biasing resistor. The gate electrode 112 should then be grounded for signal frequencies by a bypass capacitor. The substrate 114 of semiconductor material is connected to a source of bias voltage $-V_2$ may, if desired, be the same bias source as the bias voltage source $-V_1$, with the provision that the appropriate voltage may be obtained by means of a voltage divider network, for example. A capacitor 116 is coupled between the substrate 114 and ground to bypass signal frequencies.

Output signals are derived through a capacitor 118 which is connected between the drain electrode 120 of the field-effect transistor 110 and a utilization circuit, not shown. An inductor 122 is connected between the drain electrode 120 and a source of operating voltage +V as indicated. The inductor 122 forms a tunable output circuit with the capacitance exhibited by the rectifying junction 123. A bypass capacitor 124 is connected between the source of operating potential +V and ground.

The operation of the circuit shown in FIGURE 6 is similar to the operation of the circuit shown in FIGURE 5. The capacitance exhibited by the rectifying junctions that exist respectively between the drain and source electrodes of each of the transistors 94 and 110 and the corresponding substrates of semiconductor material is a function of the reverse bias voltages across each of the rectifying junctions. The capacitances exhibited by the rectifying junctions 93 and 123 resonate respectively with the inductances of inductors 98 and 122 to provide tunable input and output circuits to the amplifier. The inductor 106, in turn resonates with the capacitances exhibited by the rectifying junctions 125 and 127 that exist between the drain electrode 104 and the substrate 100 and the source electrode 108 and the substrate 114, respectively.

A variation of the circuit shown in FIGURE 6 is shown by the dotted line 130 and which represents a direct connection between the drain electrode 104 and the source electrode 108. In the latter case the inductor 106 is excluded from the circuit and the variation of the reverse bias voltage applied to each of the substrates of semiconductor material provides tuning of the input and output circuits of the amplifier.

Figure 7:
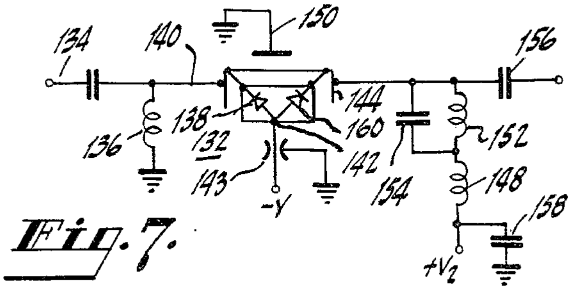
FIGURE 7 is a schematic circuit diagram of a tunable converter circuit embodying the invention.

Reference is now made to FIGURE 7 of the drawings which is a schematic circuit diagram of a converter circuit utilizing a field-effect transistor 132, similar to the one shown in FIGURES 1 and 2, as the mixer-amplifier element of the circuit. Input signals are coupled through a coupling capacitor 134 to a tunable input circuit, including an inductor 136 and the capacitance exhibited by the rectifying junction 138, from a signal source electrode 140 and a point of fixed potential shown as ground. The substrate 142 of semiconductor material is coupled to a control voltage source —V, as indicated. The feedthrough capacitor 143 bypasses the control voltage source —V to ground at signal frequencies, whereby the capacitance exhibited by the rectifying junction 138 is effectively connected across the inductor 136.

The gate electrode 150 of transistor 132 is grounded. The drain electrode 144 is coupled to a source of operating voltage $+V_2$ through an intermediate frequency (I.-F.) parallel tank circuit, including a capacitor 154 and an inductor 152 and an inductor 148 which is connected in series with the I.-F. tank circuit. A capacitor 158 bypasses the operating voltage source $+V_2$ at intermediate local oscillator signal frequencies. Intermediate frequency output signals are derived from the drain electrode 144 through a coupling capacitor 156, which is connected to a utilization circuit, not shown.

As explained in connection with FIGURES 5 and 6, the rectifying junctions of an insulated-gate field-effect transistor exhibit a capacitance as a function of the reverse bias voltage (control voltage) applied thereto. In the circuit shown in FIGURE 7, the difference between the control voltage —V and the portions of the operating voltage $+V_2$, respectively appearing at the drain and source electrodes 144 and 140, control the capacitance exhibited by the rectifying junctions 160 and 138.

The inductance of the inductor 148 resonates with the capacitance exhibited by the rectifying junction 160 at the local oscillator frequency. The low impedance I.-F. circuit effectively connects the capacitance exhibited by the rectifying junction across the oscillator's inductance (inductor 148). The required oscillator's feedback path to provide oscillations is completed through ground.

Variation of the control voltage —V changes the capacitance exhibited by each of the rectifying junctions 138 and 160. The variation in capacitance tunes the signal input circuit to a different frequency and at the same time changes the frequency of oscillation of the local oscillator by equal amount, thereby providing a difference frequency (intermediate frequency) which is substantially the same frequency at any input signal frequency.

Although the change in capacitance exhibited by each of the rectifying junctions is different for a given variation in the control voltage, tracking of the local oscillator frequency and of the frequency to which the input circuit is tuned is accomplished because the required variation in capacitance of the local oscillator is smaller than the required capacitance variation in the signal input circuit. As long as the local oscillator's frequency is higher than the frequency of the signal input circuit by an amount equal to the intermediate frequency, a change in the frequency of the input circuit requires a smaller percent change in the local oscillator's frequency in order that the I.-F. frequency remains constant. Because the change of frequency is effected by a variation of the capacitance (rectifying junction), a smaller change in capacitance is thus needed.

To provide automatic frequency control, if desired, a frequency detector circuit is coupled to the I.-F. circuit to derive a D.-C. voltage which is a function of the I.-F. output frequency. The voltage so derived is utilized as the control voltage, whereby the frequency of the local oscillator is adjusted. An advantage of this circuit is that the signal input circuit is simultaneously tuned for optimum gain at the frequency of operation thereby providing an oscillator circuit having both automatic frequency control and tuning of the input circuit for maximum gain.

Reference is now made to FIGURE 8 of the drawings, which is a schematic circuit diagram of a neutralized single tuned radio frequency amplifier. The insulated-gate field-effect transistor 162, which is similar to the transistors shown in FIGURES 1 and 2, is the active element of the amplifier circuit. The transistor 162 is connected in the common-source configuration. The source electrode 164 is connected to a point of fixed potential, shown as ground. Input signals are applied between the gate and source electrodes 166 and 164 through a coupling capacitor 168. The gate electrode 166 is coupled through a resistor 170 to ground. The drain electrode 172 is connected through an inductor 174 and a resistor 176, connected in series, to a source of operating voltage $+V_1$ as indicated.

Output signals are derived from the drain electrode 172 through a coupling capacitor 178, which is connected between the drain electrode 172 and a utilization circuit, not shown. A pair of rectifying junctions 180 and 182 exist respectively between the drain and source electrodes 172 and 164 and the substrate 184 of semiconductor material.

A source $-V_2$, as indicated, of bias voltage is applied to the substrate 184 through a feedthrough capacitor 186. Each of the rectifying junctions 180 and 182 exhibits a capacitance as a function of the reverse bias voltage applied across it, as previously explained in reference with FIGURES 5 and 6. The capacitance exhibited by the rectifying junction 180 in conjunction with the inductance of the inductor 174, determines the frequency of operation of the circuit.

The radio frequency amplifier circuit is neutralized for energy fed back through the intrinsic capacitance that exists between the drain and gate electrodes 172 and 166, by means of a balanced-bridge type neutralizing network. The bridge network includes the intrinsic capacitance between the drain and gate electrodes 172 and 166; the capacitance exhibited by the rectifying junction 180, a variable capacitor 188, connected between the gate electrode 166 and the drain electrode 172 (through the inductor 174); and a fixed capacitor 190 which completes the signal path through the capacitor 188 to ground. Thus, the capacitor 188 and the capacitor 190 constitute one leg of the bridge, and the feedback capacitor $C_f$ and the capacitance exhibited by the rectifying junction 180 constitute the other leg.

The condition for balancing the bridge is expressed by the relationship $$\frac{C_{188}}{C_{190}}=\frac{C_f}{C_d}$$

where $C_{188}$ is the capacitance exhibited by the variable capacitor 188, $C_{190}$ is the capacitance of the fixed capacitor 190, $C_f$ is the interelectrode feedback capacitance between the drain and gate electrodes 172 and 166, $C_d$ is the capacitance exhibited by the rectifying junction 180. When the amplifier circuit is tuned at a different frequency, the ratios above mentioned should remain equal. That is if the capacitance $C_d$ should be changed by a factor R, for example, the capacitance $C_f$ should also be changed by a factor R.

Tuning of the amplifier circuit is effected by reverse biasing the rectifying junction 180 to exhibit a predetermined capacitance. The variable capacitor 188 is set to a predetermined value of capacitance to balance the bridge in accordance with the value of capacitance exhibited by the rectifying junction 180 and provide neutralization of the circuit at the operating signal frequency.

A variation in the reverse biasing voltage $-V_2$, to tune the amplifier circuit to a different frequency, does not substantially vary the neutralization of the circuit; in contrast to capacitance bridge neutralized amplifiers in the prior art. The variation in the neutralization of the amplifier circuit is reduced, and hence bridge balance is substantially maintained, by virtue of the control on the source-drain current exerted by the voltage applied to the substrate 184 due to field-effect action.

In operation, as the amplifier circuit is tuned to a different frequency by varying the bias voltage from the voltage source $-V_2$, due to field-effect action the source-drain current is increased or decreased depending on the direction of the change in the bias voltage. If the incremental change in bias voltage increases the net reverse biasing voltage across the rectifying junction, the capacitance exhibited by the rectifying junction 180 is decreased tuning the amplifier circuit to a higher frequency. The source-drain current is in turn decreased, due to the field-effect action of the substrate 184, which decreases the voltage drop across the resistor 176. Thus the source-drain voltage is increased. The feedback capacitance $C_f$ decreases in value as the net voltage between the source and drain electrodes 166 and 172 increases due to the intrinsic characteristics of the insulated-gate field-effect transistor.

Because the capacitance characteristics of the rectifying junction 180 (which varies as a function of the bias voltage) and the feedback capacitance (which varies as a function of the drain-source voltage) are proportional, the variation of the capacitance exhibited by the rectifying junction 180 is accompanied by a change in the feedback capacitance which substantially tends to maintain the capacitance bridge balanced.

The circuits shown in FIGURES 5, 6, 7 and 8 may be utilized for example in a frequency modulated (FM) signal receiver, having electric tuning of the first amplifier and the converter circuits. The FM receiver could also have, in addition, automatic frequency control without any circuit modifications. For example, the local oscillator of the converter circuit and the radio frequency tuned circuits could be controlled by a control voltage having an amplitude that varies as a function of the signal frequency.

What is claimed is:

1. A tunable signal translating circuit including:
   an insulated-gate field-effect transistor having source, drain and gate electrodes on a substrate of semiconductor material,
   a first inductor, circuit means coupling said first inductor between said source electrode and said semiconductor substrate,
   a second inductor, circuit means coupling said second inductor between said drain electrode and said semiconductor substrate; input circuit means coupled between said gate electrode and one of said source and drain electrodes for applying input signals to be translated, and
   means for applying an adjustable control voltage to said substrate to simultaneously tune the circuits including said first and second inductors as a function of the amplitude of said control voltage.

2. A tunable signal translating circuit as defined in claim 1 in which said first inductor is of a value to resonate with the interelectrode capacitance between said source electrode and said substrate at a desired frequency, and said second inductor is of a value to resonate with the interelectrode capacitance between said drain electrode and said semiconductor substrate at a predetermined frequency.

3. A tunable signal translating circuit including first and second insulated-gate field-effect transistors each having source, gate and drain electrodes on a substrate of semiconductor material,
   a first inductor, circuit means coupling said first inductor between said source electrode and said semiconductor substrate of said first insulated-gate field-effect transistor,
   a second inductor, circuit means coupling said second inductor between said drain electrode of said first transistor and source electrode of said second transistor and a third inductor coupled between said drain electrode and said semiconductor substrate of said second insulated-gate field-effect transistor, circuit means coupling said gate electrodes of said first and second insulated-gate field-effect transistors to one of said drain and source electrodes of said first and second insulated-gate field-effect transistors for applying an input signal to one of said first and second insulated-gate field-effect transistors and for translation of said signal by said translating circuit, and
   means for respectively applying adjustable control voltages to said semiconductor substrates of said first and said second insulated-gate field-effect transistors to tune the circuit including said first, second and third inductors as a function of the amplitude of said control voltage.

4. A converter circuit including,
   a field-effect transistor having source and drain electrodes on a substrate of semiconductor material and a gate electrode insulated from said substrate, means including first and second rectifying junctions respectively coupled between said source and drain electrodes and said substrate, said first and second rectifying junctions each exhibiting a variable capacitance as a function of a reverse biasing voltage applied across said rectifying junctions,
   tunable input circuit means including a first inductor and the capacitance exhibited by said first rectifying junction effectively coupled between said gate and source electrodes for applying input signals to said converter circuit,
   circuit means for effectively coupling an oscillator circuit, including a second inductor and said capacitance of said second rectifying junction, between said gate and drain electrodes to provide local oscillations,
   circuit means for coupling a tunable output circuit between said drain and gate electrodes for deriving output signals having a frequency equal to the difference frequency between said signal and local oscillator frequencies,
   means coupled between said output circuit means and said gate electrode for providing an operating voltage to said converter circuit, and
   means coupled between said gate electrode and said substrate for applying a control voltage to control the capacitance exhibited by each of said rectifying junctions whereby said input circuit and said local oscillator circuit are returned maintaining the same difference frequency.

5. A converter circuit comprising,
   an insulated-gate field-effect transistor having source, drain and gate electrodes formed on a substrate of semiconductor material,
   input circuit means exhibiting a predetermined frequency response coupled to said source electrode for applying input signals,
   tunable circuit means coupling said drain and gate electrodes for regenerative feedback to sustain local oscillation in said converter circuit,
   means coupled to said drain electrode for deriving an output signal, and
   means coupled to said substrate for applying a voltage that simultaneously controls the frequency of local oscillation and alters the frequency response of said signal input circuit.

6. A converter circuit comprising an insulated-gate field-effect transistor having source, drain and gate electrodes formed on a substrate of semiconductor material,
   input circuit means exhibiting a predetermined frequency response coupled to said source electrode for applying input signals,
   output circuit means exhibiting a predetermined frequency response coupled to said drain electrode for deriving output signals,
   means exhibiting a predetermined frequency response coupled between said drain and gate electrodes to provide local oscillations, and
   means coupled to said substrate for applying a voltage that simultaneously controls the frequency of local oscillations and controls the frequency response of said input circuit for maximum gain.

7. An amplifier circuit including, a field-effect transistor having first and second electrodes on a substrate of semiconductor material and a gate electrode insulated from said substrate, means including first and second rectifying junctions respectively coupled between said first and second electrodes and said substrate, said first and second rectifying junctions each exhibiting a variable capacitance as a function of a reverse biasing voltage applied across said rectifying junctions.

input circuit means coupled to said first electrode, including a first inductor and the capacitance exhibited by said first rectifying junction, for applying input signals to said amplifier, output circuit means coupled to said second electrode, including a second inductor and said capacitance of said second rectifying junction, circuit means coupling said gate electrode to a point of reference potential, means coupled to said second inductor for applying a unidirectional operating voltage to said amplifier circuit, and means coupled to said substrate for applying a bias voltage to said substrate to control the capacitance exhibited by said first and second rectifying junctions.

8. An amplifier circuit comprising, an insulated-gate field-effect transistor having a source, drain and gate electrodes formed on a substrate of semiconductor material, input circuit means including a first inductor coupled between said source and gate electrodes, output circuit means including a second inductor coupled between said drain and gate electrodes, and means for applying a reverse biasing voltage between said source and drain electrodes and said substrate for simultaneous tuning of said input and output circuits.

9. An amplifier circuit comprising, an insulated-gate field-effect transistor having source, drain and gate electrodes on a substrate of semiconductor material, first circuit means coupled between said drain and gate electrodes exhibiting a predetermined frequency response, second circuit means coupled between said source and gate electrodes exhibiting a predetermined frequency response, and means coupled between said substrate and gate electrodes for applying a voltage to alter simultaneously the frequency response characteristic of said first and second circuit means.

10. An amplifier circuit as defined in claim 9 in which the voltage applied between said gate and substrate electrodes is variable.

11. A radio frequency amplifier circuit including an insulated-gate field-effect transistor having source, drain and gate electrodes on a substrate of semiconductor material and having first and second rectifying junctions respectively coupled between said drain and source electrodes and said semiconductor substrate, said insulated-gate field-effect transistor also having intrinsic capacitance between said drain and gate electrodes providing a feedback path coupling energy from said drain electrode to said gate electrode, input circuit means coupled between said gate and source electrodes for applying input signals to said amplifier circuit, means for applying an operating potential between said drain and source electrodes including a resistor and an inductor connected in series to each other, said inductor comprising in conjunction with the capacitance exhibited by said first rectifying junction a tunable output circuit, a first capacitor connected between said input and output circuits to provide neutralization of said R-F amplifier circuit, a second capacitor coupled across said resistor for bypassing said resistor at operating signal frequencies, and means coupled between said semiconductor substrate and said source electrode for applying a reverse biasing voltage to control the capacitance exhibited by said first rectifying junction to tune said output circuit to a desired frequency, the change in capacitance of said first rectifying junction being accompanied by a change in source-drain current flow due to the field-effect action of said substrate, whereby the voltage drop across said resistor is varied thereby varying the drain-source voltage, which in turn varies the intrinsic capacitance between said drain and gate electrodes proportionally to the change in capacitance exhibited by said first rectifying junction maintaining the neutralization of said radio frequency amplifier circuit.

12. A signal translating circuit comprising an insulated-gate field-effect transistor having source, drain and gate electrodes on a substrate of semiconductor material and having a rectifying junction coupled between said drain electrode and said semiconductor substrate, said rectifying junction exhibiting a capacitance as a function of a reverse bias voltage applied thereacross, input circuit means coupled between said gate and source electrodes, output circuit means coupled between said drain and source electrode including an inductor which forms with the capacitance exhibited by said rectifying junction a tunable circuit, a capacitor connected between said input and output circuit to provide neutralization, means coupled between said drain and source electrodes for applying operating potential including a resistor, a capacitor connected across said resistor for bypassing said resistor at signal frequencies, and means coupled between said semiconductor substrate and said source electrode for applying a control voltage to control the capacitance exhibited by said rectifying junction thereby tuning said output circuit to a desired frequency.

13. A signal translating circuit comprising:

an insulated-gate field-effect semiconductor device having drain and source regions formed on a substrate of semiconductor material, the portion of said substrate separating said drain and source regions providing a current path of controllable conductivity between said drain and source regions, and a gate electrode insulated from said substrate and overlying at least a portion of said region for controlling the conductivity of said current path, the interface between said substrate and said drain and source regions forming rectifying junctions, said rectifying junctions exhibiting capacitive characteristics, the magnitude of said capacitive characteristic being a function of a voltage applied across said rectifying junctions;

an inductive circuit;

first circuit means coupling said inductive circuit between one of said drain and source regions and said substrate so that said inductive circuit and said capacitive characteristics exhibited by the rectifying junction between said one of said drain and source regions and said substrate form a tuned resonant circuit;

second circuit means, including a plurality of terminals adapted to be connected to a source of energizing potential, coupling the other of said drain and source regions to said first circuit means to provide a direct current path between said drain and source regions;

input circuit means coupled between said gate and one of said drain and source electrodes for applying an input signal to be translated, and means for applying an adjustable control voltage to said substrate to control the magnitude of said capacitive characteristic exhibited by the rectifying junction between said one of said drain and source regions and said substrate, to adjust the resonant circuit to a predetermined frequency.

14. A signal translating circuit comprising:
an insulated-gate field-effect transistor having first, second, and gate electrodes on a substrate of semiconductor material;
circuit means exhibiting a predetermined frequency response coupled to one of said first and second electrodes;
input circuit means coupled between said gate electrode and one of said first and second electrodes for applying input signals to be translated by said signal translating circuit; and
means for applying a voltage to said substrate to alter the frequency response of said circuit means as a function of the applied voltage.

References Cited by the Examiner

UNITED STATES PATENTS

| | | | |
|---|---|---|---|
| 3,010,033 | 11/1961 | Noyce | 317—234 |
| 3,102,230 | 8/1963 | Kahng | 307—88.5 |

ARTHUR GAUSS, *Primary Examiner.*

JOHN W. HUCKERT, *Examiner.*